US011309036B1

(12) United States Patent
Teoh et al.

(10) Patent No.: US 11,309,036 B1
(45) Date of Patent: Apr. 19, 2022

(54) SYSTEMS AND METHODS OF IMPLEMENTING A CALIBRATION WORDLINE TO COMPENSATE FOR VOLTAGE THRESHOLD SHIFT IN NAND FLASH MEMORY

(71) Applicant: DELL PRODUCTS L.P., Round Rock, TX (US)

(72) Inventors: Chai Im Teoh, Singapore (SG); Lip Vui Kan, Hillbrooks (SG)

(73) Assignee: Dell Products L.P., Round Rock, TX (US)

( * ) Notice: Subject to any disclaimer, the term of this patent is extended or adjusted under 35 U.S.C. 154(b) by 30 days.

(21) Appl. No.: 17/070,590

(22) Filed: Oct. 14, 2020

(51) Int. Cl.
*G11C 16/26* (2006.01)
*G06F 3/06* (2006.01)
*G11C 11/56* (2006.01)
*G06F 11/10* (2006.01)
*G11C 16/04* (2006.01)

(52) U.S. Cl.
CPC ............ *G11C 16/26* (2013.01); *G06F 3/0619* (2013.01); *G06F 3/0659* (2013.01); *G06F 3/0679* (2013.01); *G06F 11/1068* (2013.01); *G11C 11/5642* (2013.01); *G11C 11/5671* (2013.01); *G11C 16/0483* (2013.01)

(58) Field of Classification Search
CPC . G11C 16/26; G11C 11/5642; G11C 11/5671; G11C 16/0483; G06F 3/0619; G06F 3/0659; G06F 3/0679; G06F 11/1068
See application file for complete search history.

(56) References Cited

U.S. PATENT DOCUMENTS

| | | | |
|---|---|---|---|
| 6,898,104 B2 * | 5/2005 | Ogiwara | G11C 7/04 365/145 |
| 8,239,618 B2 | 8/2012 | Kotzur et al. | |
| 8,266,354 B2 | 9/2012 | Farhan et al. | |
| 8,671,241 B2 | 3/2014 | Molloy | |
| 10,275,162 B2 | 4/2019 | Kan et al. | |
| 10,741,260 B1 * | 8/2020 | Kavalipurapu | G11C 16/32 |
| 2008/0158950 A1 * | 7/2008 | Aritome | G11C 11/5628 365/185.03 |
| 2008/0266987 A1 * | 10/2008 | Terzioglu | G11C 7/1057 365/189.07 |

(Continued)

OTHER PUBLICATIONS

Cai et al., "Error Characterization, Mitigation, and Recovery in Flash Memory Based Solid-State Drives", Errors, Mitigation, and Recovery in Flash Memory SSDs, 2017, 31 pgs.

(Continued)

*Primary Examiner* — Guy J Lamarre
(74) *Attorney, Agent, or Firm* — Egan, Enders & Huston LLP.

(57) ABSTRACT

Systems and methods that may be implemented for that may be implemented to compensate for NAND flash memory voltage threshold (Vth) shift by using one or more designated calibration wordlines that are programmed into the NAND flash memory with a pre-defined data pattern. In one example configuration, the disclosed systems and methods may be automatically implemented by a SSD controller when needed to compensate for flash memory voltage threshold (Vth) shift that occurs, e.g., due to NAND memory cell charge loss due to power-off data retention over an extended period of time.

20 Claims, 6 Drawing Sheets

(56) References Cited

U.S. PATENT DOCUMENTS

| | | | | |
|---|---|---|---|---|
| 2017/0372777 | A1* | 12/2017 | Walker | G11C 11/412 |
| 2019/0147961 | A1* | 5/2019 | Lee | G11C 16/12 |
| | | | | 365/185.05 |
| 2019/0362796 | A1* | 11/2019 | Choi | G11C 16/26 |
| 2021/0019208 | A1* | 1/2021 | Sheperek | G11C 16/10 |

OTHER PUBLICATIONS

Parnell, "NAND Flash Basics & Error Characteristics", Flash Memory Summit, 2016, 20 pgs.

Supriya Kulkarni et al., "Study of Bad Block Management and Wear Leveling in NAND Flash Memories", International Journal of Research in Engineering and Technology, 2013, 5 pgs.

Evanson, "Anatomy of a Storage Drive: Solid States Drives", Techspot, Printed From Internet Sep. 28, 2020, 4 pgs.

Wikipedia, "Charge Trap Flash", Printed From Internet Oct. 8, 2020, 11 pgs.

Wikipedia, Flash Memory, Printed From Internet Oct. 10, 2020, 31 pgs.

Hruska, How Do SSDs Work?—Extreme Tech, Printed from Internet Sep. 27, 2020, 8 pgs.

Larrivee, "Solid State Drive Primer #4-NAND Architecture—Pages & Blocks", Mar. 20, 2015, 5 pgs.

Techdignet, "NAND Flash Primer-Welcome to techdig.net", Printed From Internet Sep. 27, 2020, 7 pgs.

Novotny et al., "NAND Flash Memory Organization and Operations", Journal of Information Technology & Software Engineering, 2015, 8 pgs.

\* cited by examiner

SYSTEMS AND METHODS OF IMPLEMENTING A CALIBRATION WORDLINE TO COMPENSATE FOR VOLTAGE THRESHOLD SHIFT IN NAND FLASH MEMORY

FIELD

This invention relates generally to non-volatile memory and, more particularly, to NAND flash memory.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems employ solid-state storage devices, (e.g., solid-state drives) to store data and programs of instructions for later retrieval. A solid-state drive (SSD) is a data storage device that uses non-volatile solid-state memory to store persistent data that is retained while the system is powered off. A SSD may emulate a hard disk drive interface to easily replace a hard disk drive, and SSDs often use NAND flash memory as an underlying storage medium. A page is the smallest NAND unit which may be written, and a traditional single-level cell (SLC) NAND media stores one bit per cell. However, NAND memory has been scaled up in density by putting more bits in a single cell. Examples of denser types of NAND media include what is commonly referred to as multi-level cell (MLC) memory having two bits per cell, triple-level cell (TLC) memory having three bits per cell, and quad-level cell (QLC) memory having four bits per cell.

SSD NAND memory includes flash memory cells. Each flash memory cell is typically a floating gate Metal Oxide Semiconductor Field Effect transistor (MOSFET) that stores an electron charge. The charge is stored in a floating gate that is electrically connected to a bitline (BL). A control gate is electrically connected to a wordline (WL) and overlies the floating gate. The control gate is separated from the floating gate by an oxide insulator, and the floating gate is separate from the source and drain of the memory cell substrate by an oxide insulator. Current flow between the source and drain of the memory cell may be controlled by combination of the floating gate transistor voltage and a voltage applied to the control gate. Thus, different voltage combinations that are applied to the WL and BL of a flash memory cell determine a read, erase or program (write) operation on the cell.

To read a NAND flash memory cell, a designated read compare voltage (Vr) is applied by a SSD controller to the control gate of the memory cell to read the charge on the floating gate, and the designated value of Vr depends on the voltage threshold (Vth) of the memory cell. In this regard, the floating gate of the memory cell reads as "0" when the floating gate contains an electron charge, and the floating gate of memory cell reads as "1" when the floating gate contains no electron charge. When the floating gate is charged (0), application of the correct Vr causes does not cause current to flow from source to drain of the memory cell. However, when the floating gate is not charged (1), application of the correct Vr causes current to flow from source to drain of the memory cell. Therefore, data from the memory cell is read by determining whether or not current flows from source to drain when the correct Vr is applied to the control gate.

A NAND flash block consists of pages which are written and read as a unit. A flash memory cell is located at every crossing point of wordlines (WL) and bitlines (BL). Control gates are linked to the WL, where the decoded address is applied. A page is defined as cells that are linked with the same WL. A voltage is applied concurrently to the WL and BL by the SSD controller to determine the operation as reading, erasing or programming. A WL in TLC has 3 pages, and in QLC has 4 pages.

SSD devices used for personal computers and tablets are required to meet a minimum power off data retention requirement, and should retain data in an unaltered form for a specified period of time. However, power off data retention error is a reliability issue for NAND-based SSD products. In particular, when a NAND-based SSD is powered off, charge loss occurs from the nitride storage layer or floating gate in the NAND flash. This charge loss causes the Vth (and therefore Vr) distribution for the NAND flash cells to be shifted towards lower values, and the rate of electron escape increases with increasing temperatures. When the NAND-based SSD is powered back on, the shifted Vth will cause a high Raw Bit Error Rate (RBER) during data read out.

During data read out, data read from NAND flash cells of a conventional SSD is compared by the SSD controller against a default read compare voltage level (Vr). If the read data exhibits a high RBER due to a shifted Vth such as described above, then the SSD controller will initiate a read-retry operation. During the read-retry operation, the SSD controller uses SSD firmware to vary the Vr in an attempt to compensate for the Vth shift. This SSD firmware is pre-programmed with a pre-defined table of fixed read-retry levels, and the SSD controller makes multiple read attempts by adjusting Vr levels according to the table entries until the read errors are corrected or determined to be uncorrectable. If all read-retry entries in the table are attempted and the read errors are still uncorrectable, the SSD controller will invoke a next stage of error correction, such as low-density parity-check (LDPC) and Redundant Array of Independent Disks (RAID). If the RBER are beyond correction capability, then the SSD returns uncorrectable errors to the host. At any stage of correction, SSD command response time will be longer, especially when deeper stages of the error correction mechanism are being invoked.

Conventional SSD firmware integrates fixed read compare voltage levels that been defined during product design. SSD manufacturers run characterization on a given component at high and low temperature, and on a SSD component at high temperature acceleration for validation. The predefined table of read-retry levels of the SSD firmware is determined based on NAND characterization performed by SSD manufacturers, and are based on temperature acceleration or a data extrapolation from a limited number of samples during development, i.e., the data is collected from a limited number of NAND samples and limited lots of same. However, when a qualified SSD enter mass production, SSDs are built to ship with NAND wafers having much wider variance and skews. As a result, conventional SSD users encounter data retention errors and uncorrectable errors in the field due to NAND charge loss and when the resulting RBER are not within the projected curve that has been plotted during NAND development.

Conventional SSD NAND flash memory cells are also implemented using charge trap flash (CTF) memory technology that employs a MOSFET having a charge trap layer that stores an electron charge in a manner similar to the above-described floating gate layer technology. However, whereas conventional floating gate technology utilizes a conductive doped polycrystalline silicon floating gate layer, charge trap flash (CTF) memory technology instead uses a charge trap layer made of a silicon nitride insulator material in place of the conductive doped polycrystalline silicon floating gate layer. Read, erase and program (write) operations are similarly performed on a NAND charge trap layer as described above for a NAND floating gate layer.

SUMMARY

Disclosed herein are systems and methods that may be implemented in one embodiment to compensate for NAND flash memory voltage threshold (Vth) shift by using one or more designated calibration wordlines that are programmed into the NAND flash memory with a pre-defined data pattern. In one exemplary embodiment, each NAND block of a flash memory device (e.g., such as a SSD NAND flash memory device) may be programmed with at least one calibration wordline (WL). The calibration WL may be the first or last WL of each NAND block, although any other WL (or combination of multiple WLs) of a given NAND block may be so programmed as a calibration WL, including WLs located between the first and last WLs of the given NAND block. In one embodiment, a single level of single-level cell (SLC) NAND memory may include at least one calibration WL having a pre-defined data pattern. In other embodiments, a pre-defined data pattern may cover all levels in NAND media devices that are denser than SLC, e.g., such as multi-level cell (MLC) memory having two bits per cell, triple-level cell (TLC) memory having three bits per cell, and quad-level cell (QLC) memory having four bits per cell. The disclosed systems and methods may be implemented, for example, with memory structures using floating gate flash memory technology or using charge trap flash (CTF) flash memory technology)

In one example embodiment, the disclosed systems and methods may be automatically implemented by a SSD controller when needed to compensate for flash memory voltage threshold (Vth) shift that occurs, e.g., due to NAND memory cell charge loss due to power-off data retention over an extended period of time. Such a shift in flash memory voltage threshold (Vth) may be detected by the SSD controller when at least a portion of the pages in a SSD NAND block return a high number of read errors (e.g., a high Raw Bit Error Rate (RBER)) when read by the SSD controller using the default read compare voltage (Vr). In one embodiment, a high number of read errors may be predefined as a maximum threshold number of read errors (e.g., a high RBER value may be predefined as a maximum RBER threshold value) as desired to fit the needs or requirements of a given application. However, any other technique may be employed that is suitable for determining a number of read errors or a read error rate.

Upon detection of a high RBER value when reading data from a given block of a SSD NAND flash memory device, the SSD controller may then read the predefined data pattern from the designated calibration WL of the same given SSD NAND block using a default Vr that is predefined for the SSD NAND flash memory device. The SSD controller may then compare this read data against a reference copy of the same predefined data pattern that has been previously saved in SSD firmware. The SSD may then analyze any differences between the data of the data pattern read from the given NAND block designated calibration WL and the reference copy of the same predefined data pattern to estimate or determine a magnitude of voltage shift (Vsh) that has occurred in the Vth distribution due to the NAND memory cell charge loss, e.g., that has occurred due to SSD power-off data retention over an extended period of time. The SSD controller may then calculate a new and corrected read compare voltage magnitude (Vr_1) by subtracting the same voltage shift magnitude (Vsh) from the default Vr level, and then may use the corrected Vr_1 to read data with a reduced RBER value from the entire given SSD NAND block.

The disclosed systems and methods may be implemented in one embodiment to provide a dynamic read-retry mechanism for NAND flash memory that does not require or use a conventional predefined fixed read-retry table. The disclosed systems and methods may also be implemented in one embodiment to compensate and correct for high RBER data reads by reading corrected data from the given NAND flash memory block in a reduced amount of time and with greater rate of success as compared to conventional techniques. In this regard, the disclosed systems and methods may be implemented to successfully read corrected data from the given NAND flash memory block in a single read-retry step using a corrected read compare voltage magnitude (Vr_1), as opposed to a multiple number of read-retry steps that are typically required using a conventional read-retry table. The disclosed pre-programmed calibration wordline/s thus allow corrected data to be read from a NAND flash memory block in less time than is typically required when using the conventional read-retry technique to exhaust multiple (and potentially all) entries in a conventional read-retry table, and especially when the conventional fixed read-retry table technique does not successfully correct the Vth shift read errors and therefore may further require low-density parity-check (LDPC) and Redundant Array of Independent Disks (RAID) correction mechanisms.

The disclosed systems and methods may be advantageously implemented in a manner that caters to the unequal quality of different NAND die in a NAND SSD device. Given that floating gate (or charge trap) charge loss rate typically increases with the number of program/erase cycles, the Vth shift across pages in the same NAND block typically suffers the same extent due to the same program/erase cycles. However, the amount of Vth shift may vary across different NAND die, even for those die from the same wafers or lots. Moreover, there are outlier NAND die/s that exhibit Vth shift characteristics that do not follow the manufacturer's estimation during product development. These types of Vth shift variations are correctable with use of the calibration wordline of the disclosed systems and methods, but are not covered or taken into account by the conventional technique using a fixed table of read-retry levels.

Thus, the disclosed systems and methods may be implemented to improve SSD data throughput performance without impacting reliability and endurance, and also to reduce the incidence of SSD firmware misjudging the health of NAND blocks. This in turn reduces field failure incidence rate. Moreover, the pre-defined data pattern that is written in a calibration WL of each NAND block does not consume much user NAND area compared to overall NAND block size. For example, each WL in typical TLC memory is 48 KB and 64 KB in QLC memory, while a typical 3D TLC NAND block size is 18 MB. Thus, the predefined data pattern calibration data will consume only about 0.35% space of a typical 3D TLC NAND block. With increasing NAND block density for 3D TLC and QLC memory, the percentage of space taken by calibration data is even less. Further, SSD designers may consider the risk and impact of data retention, estimate spare blocks in each NAND die, and further calculate the number of spare blocks needed for calibration in SSD, to achieve a balanced design for SSD reliability.

In one respect, disclosed herein is a method, including: reading data from at least one memory block using multiple separate wordlines, the at least one memory block including multiple memory pages that each include a different group of memory cells, each of the memory cells storing an electron charge having a voltage corresponding to a stored data value, and each of the separate wordlines being coupled to a different group of the memory cells that corresponds to one of the memory pages of the at least one memory block; where a designated one of the multiple memory pages includes a group of memory cells that are programmed with stored data values corresponding to a pre-defined data pattern. The method may further include: reading a current data pattern stored in the memory cells of the designated memory page using a default read compare voltage (Vr); then comparing the read current data pattern to the pre-defined data pattern to determine a magnitude of a shift in voltage of the stored charge in each of the memory cells of the designated memory page between the current data pattern and the pre-defined data pattern; and then determining an adjusted read compare voltage (Vr-1) based on the determined magnitude of the shift in voltage of the stored charge in the memory cells of the designated memory page.

In another respect, disclosed herein is a system, including: at least one memory block including multiple memory pages that each include a different group of memory cells, each of the memory cells storing an electron charge having a voltage corresponding to a stored data value; and at least one programmable integrated circuit coupled to multiple separate wordlines, each of the separate wordlines being coupled to a different group of memory cells that corresponds to one of the memory pages of the at least one memory block. A designated one of the multiple memory pages may include a group of memory cells that are programmed with stored data values corresponding to a pre-defined data pattern; and the at least one programmable integrated circuit may be programmed to: read a current data pattern stored in the memory cells of the designated memory page using a default read compare voltage (Vr); then compare the read current data pattern to the pre-defined data pattern to determine a magnitude of a shift in voltage of the stored charge in each of the memory cells of the designated memory page between the current data pattern and the pre-defined data pattern; and then determine an adjusted read compare voltage (Vr-1) based on the determined magnitude of the shift in voltage of the stored charge in the memory cells of the designated memory page.

In another respect, disclosed herein is an information handling system, including: a host programmable integrated circuit; and a solid state drive (SSD) coupled to the host programmable integrated circuit. The SSD may include: at least one memory block including multiple memory pages that each include a different group of memory cells, each of the memory cells storing an electron charge having a voltage corresponding to a stored data value, and at least one programmable integrated circuit coupled to multiple separate wordlines, each of the separate wordlines being coupled to a different group of memory cells that corresponds to one of the memory pages of the at least one memory block. A designated one of the multiple memory pages may include a group of memory cells that are programmed with stored data values corresponding to a pre-defined data pattern; and the at least one programmable integrated circuit of the SSD may be programmed to: read a current data pattern stored in the memory cells of the designated memory page using a default read compare voltage (Vr), then compare the read current data pattern to the pre-defined data pattern to determine a magnitude of a shift in voltage of the stored charge in each of the memory cells of the designated memory page between the current data pattern and the pre-defined data pattern, then determine an adjusted read compare voltage (Vr-1) based on the determined magnitude of the shift in voltage of the stored charge in the memory cells of the designated memory page, then re-read the stored data value of each given memory cell of the array of memory cells by determining the voltage of the stored charge in the given memory cell relative to the adjusted read compare voltage (Vr-1), and then provide the re-read data to the host programmable integrated circuit.

DESCRIPTION OF ILLUSTRATIVE EMBODIMENTS

Figure 1:
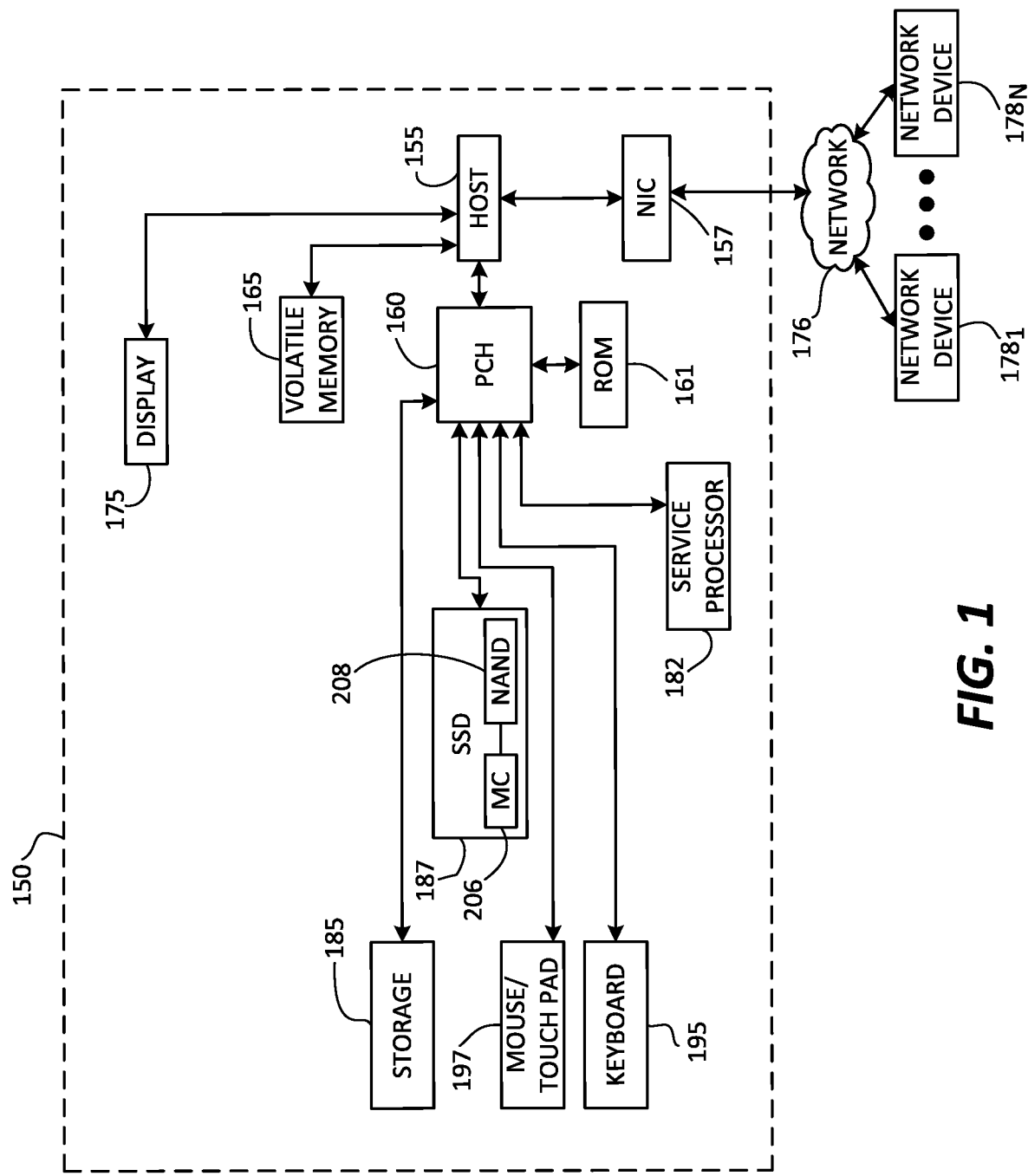
FIG. 1 illustrates a block diagram of an information handling system according to one exemplary embodiment of the disclosed systems and methods.

FIG. 1 is a block diagram of one embodiment of an information handling system 150 with which the disclosed systems and methods may be implemented to compensate for NAND flash memory voltage threshold (Vth) shift. Information handling system 150 of FIG. 1 may be a computer server system, notebook computer system, convertible computer system, desktop computer system, computer workstation, etc. It will be understood that the system configuration of FIG. 1 is exemplary only, and that the disclosed systems and methods may be implemented to compensate for flash memory voltage threshold (Vth) shift for other NAND devices of other configurations and/or types of information handing system configuration including, but not limited to, cell phones or smart phones, tablet computers, set-top boxes, etc.

As shown in FIG. 1, information handling system 150 of this exemplary embodiment includes at least one host programmable integrated circuit 155, which may each be a central processing unit CPU (e.g., such as an Intel Pentium series processor, an Advanced Micro Devices (AMD) processor, etc.) or one of many other processors or other types of suitable processing devices configured to interpret and/or execute program instructions and/or process data. In some embodiments, programmable integrated circuit 155 may interpret and/or execute program instructions and/or process data stored in system volatile memory 165, solid state drive (SSD) 187, optional additional storage media 185 and/or another component of information handling system 150. System-powered volatile memory 165 (e.g., dynamic random access memory DRAM) may be coupled as shown to host programmable integrated circuit 155 via platform controller hub (PCH) 160 which facilitates input/output functions for the information handling system. System read only memory (ROM) 161 (e.g., such as erasable programmable read only memory "EPROM", electrically erasable programmable read only memory "EEPROM", etc.) is also provided as shown for storing start up firmware, such as system BIOS. Also shown coupled to host programmable integrated circuit 155 is network interface card (NIC) 157 that is provided to enable communication across network 176 (e.g., such as the Internet or local corporate intranet) with various multiple information handling systems configured as network devices 1781-178N.

Still referring to FIG. 1, SSD 187 may be an internal or external drive coupled to PCH 160, and includes NAND Flash memory 208 and a microcontroller 206 acting as a SSD memory controller to provide storage for the information handling system. As shown, optional additional storage 185 (e.g., hard drive, optical drive, etc.) may also be coupled to PCH 160 to provide additional storage for information handling system 150. One or more input devices (e.g., keyboard 195, mouse/touchpad 197, etc.) may be optionally coupled to PCH 160 and its controller chip to enable the user to interact with the information handling system 150 and programs or other software/firmware executing thereon. A display device 175 (e.g., LED display, touchscreen display, etc.) may be coupled as shown to an integrated graphics processing unit (iGPU) of host programmable integrated circuit 155 for display of information to a user.

As further shown in this embodiment, the exemplary information handling system 150 of this embodiment may also include an optional service processor 182 suitable for the given configuration of information handling system 150 (e.g., such as embedded controller, baseboard management controller "BMC", etc.) and that is coupled to PCH 160 and its integrated controller chip as shown. It will be understood that the particular combination of information handling system components of FIG. 1 is exemplary only, and that the disclosed systems and methods may be implemented with an information handling system that includes any other suitable combination of additional, fewer or alternative information handling system components (e.g., including one or more programmable integrated circuits).

In the embodiment of FIG. 1, PCH 160 may be coupled to other components with optional interfaces such as a PCIe interface and device interfaces such as a USB (Universal Serial Bus) interface, for example. It will be understood that SSD 187 may be configured as an integral component within a chassis of information handling system 150 (e.g., internal SSD), or may be alternatively configured as an attached external storage device.

Figure 2:
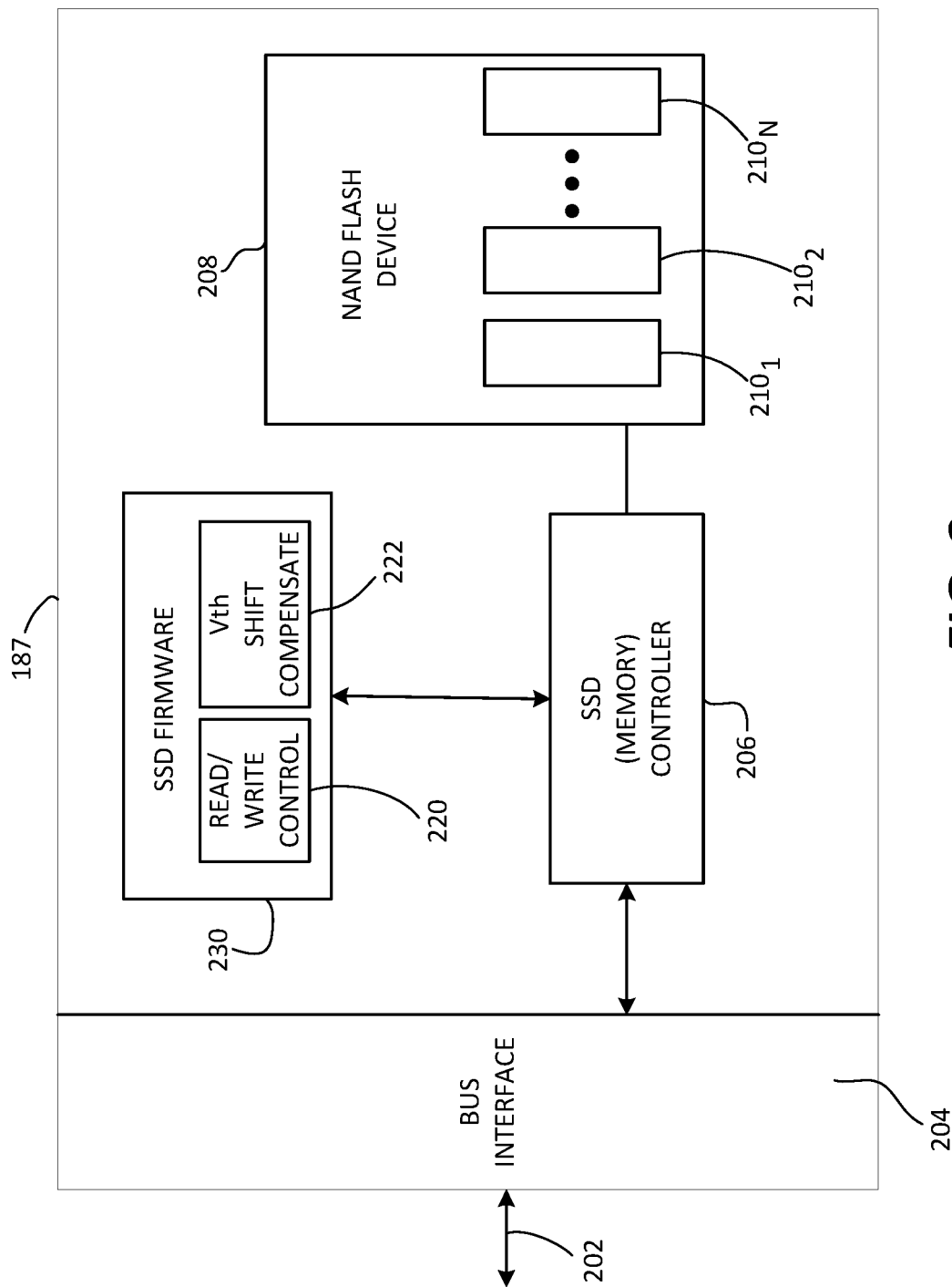
FIG. 2 illustrates a bock diagram of a solid state drive (SSD) according to one exemplary embodiment of the disclosed systems and methods.

FIG. 2 illustrates a block diagram of one exemplary embodiment of SSD 187 that stores information for information handling system 150. In the embodiment of FIG. 2, SSD 187 includes NAND flash non-volatile memory device 208 that includes multiple NAND blocks $210_1$ to $210_N$ to which data is written to and read back by host programmable integrated circuit 155 across data bus 202 (e.g., high speed PCIe 3.0 bus or other suitable data bus such as serial advanced technology attachment "SATA", serial attached SCSI "SAS", etc.) via bus interface 204. As shown, a SSD flash memory controller 206 (e.g., any suitable programmable integrated circuit such as microprocessor, microcontroller, ASIC, FPGA, etc.) is coupled to controller memory 230 (e.g., non-volatile flash memory) that stores firmware that includes read/write control logic 220 that may be used by controller 206 to control reads to and writes from the NAND blocks 210 of NAND flash memory device 208, as well as Vth shift compensation logic 222 that may be used by controller 206 to compensate for NAND flash memory voltage threshold (Vth) shift based on contents of at least one calibration wordline (WL) provided in each NAND block of a flash memory device in a manners as descried further herein.

In one embodiment, controller 206 may reference a mapping table of read/write control logic 220 in performing reads and writes in order to translate virtual logical block addresses (LBAs) of SSD 187 (as "seen" by host programmable integrated circuit 155) to physical block addresses of NAND blocks 210 of NAND flash memory device 208. Controller 206 may also reference a reference copy of a predefined data pattern that is written to a designated calibration WL of each SSD NAND block 210. In one exemplary embodiment, the memory cells of the designated calibration WL may be reserved for storing the predefined data pattern, i.e., such that the predefined data pattern is maintained within the memory cells of the designated calibration WL and is not erased or overwritten by other data during operation of SSD 187.

Further information on possible components and operation of an information handing system 150 and/or NAND flash memory device 187 may be found in U.S. Pat. Nos. 8,239,618; 8,671,241; 8,266,354; and 10,275,162, each of which is incorporated herein by reference in its entirety for all purposes.

Figure 3A:
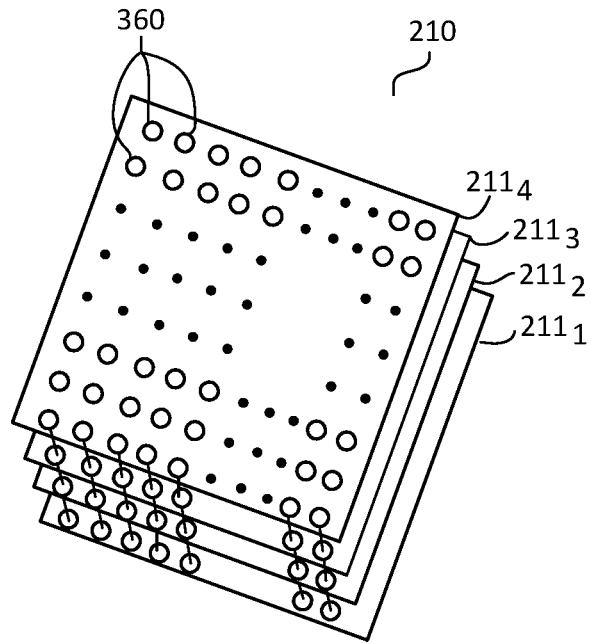
FIG. 3A illustrates a side perspective view a NAND block according to one exemplary embodiment of the disclosed systems and methods.

FIG. 3A illustrates a side perspective view of one of the NAND blocks 210 of NAND flash device 208 of FIG. 2 as it may be configured according to one exemplary embodiment of the disclosed systems and methods. It will be understood that each NAND block 210 of NAND flash device 208 may be similarly configured. In the embodiment of FIG. 3A, NAND block 210 is a quad-level cell (QLC) memory having four parallel layers $211_1$ to $211_4$ that are stacked together to provide four bits per memory cell 360, with each group of four vertically aligned memory cells 360 of the stacked layers being vertically linked together as shown. Although an exemplary quad-level cell (QLC) embodiment is shown in FIG. 3A, it will be understood that the disclosed systems and methods may be similarly implemented for NAND blocks having a differing number of stacked parallel layers, e.g., multi-level cell (MLC) memory having two stacked parallel layers providing two bits per cell, triple-level cell (TLC) memory having three stacked parallel layers providing three bits per cell, etc.

Figure 3B:
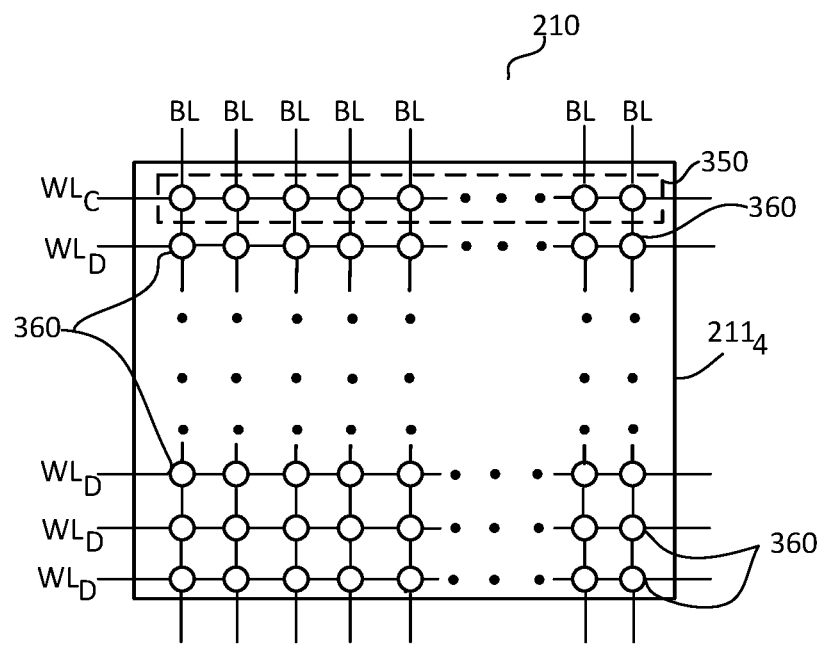
FIG. 3B illustrates a top view of a NAND block layer according to one exemplary embodiment of the disclosed systems and methods.

FIG. 3B illustrates a top view of layer $211_4$ of NAND block 210 of FIG. 3A. As shown in FIG. 3B, layer $211_4$ includes an array (or matrix) of NAND memory cells 360 arranged in a pattern of parallel columns and parallel rows. More particularly, layer $211_4$ has multiple parallel rows of NAND memory cells 360, with the NAND memory cells 360 of each row being linked together by a different wordline (WL) that is electrically connected to the control gate of each NAND cell 360 to form a NAND flash page corresponding to each wordline of FIG. 3B. As also shown in FIG. 3B, layer $211_4$ also has multiple parallel columns of NAND memory cells 360, with the NAND cells 360 of each column being linked together by a different bitline (BL) that is electrically connected to the floating gate (or charge trap) of each NAND memory cell 360 to form a NAND flash string. In one embodiment a floating gate of a memory cell 360 may be composed of a conductive doped polycrystalline silicon, and in another embodiment a charge trap layer of a memory cell 360 made be composed of a silicon nitride insulator material.

The memory cells 360 of each page of NAND flash block 210 may be written and read by SSD controller 206 as a unit. A flash memory cell 360 is located at every crossing point of wordlines (WL) and bitlines (BL). Control gates are linked to the wordline, where the decoded address is applied. Each page of memory block 210 is defined as memory cells 360 that are linked with the same wordline. A voltage may be applied concurrently to the wordline and bitline by the SSD controller 206 to determine the operation as reading, erasing or programming.

In one embodiment, each flash memory cell 360 of FIG. 3B may be a floating gate or charge trap MOSFET that stores an electron charge. In such an embodiment, the charge of each memory cell may be stored in a floating gate or a charge trap that is electrically connected to a bitline. A control gate of each memory cell 360 is electrically connected to a wordline and overlies the floating gate. The control gate is separated from the floating gate or charge trap by an oxide insulator, and the floating gate or charge trap is separate from the source and drain of a substrate of the memory cell 360 by an oxide insulator. Current flow between the source and drain of the memory cell 360 may be controlled by combination of the floating gate or charge trap transistor voltage and a voltage applied to the control gate. Thus, different voltage combinations may be applied to the wordline and bitline of a given flash memory cell 360 to determine (or select) a read, erase or program (write) operation on the given memory cell 360.

To read a given memory cell 360 of FIG. 3B, a designated read compare voltage (Vr) may be applied by the SSD controller 206 to the control gate of the given memory cell 360 to read the charge on the floating gate or charge trap, and the designated value of Vr depends on the voltage threshold (Vth) of the memory cell, i.e., the floating gate or charge trap of the memory cell 360 reads as "0" when the floating gate or charge trap contains an electron charge, and the floating gate or charge trap of the memory cell 350 reads as "1" when the floating gate or charge trap contains no electron charge. When the floating gate or charge trap is charged (0), application of the correct Vr causes does not cause current to flow from source to drain of the memory cell. However, when the floating gate or charge trap is not charged (1), application of the correct Vr causes current to flow from source to drain of the memory cell 360. Therefore, data from the memory cell 360 may be read by determining whether or not current flows from source to drain when the correct Vr is applied to the control gate.

Still referring to FIG. 3B, the memory cells 360 of at least one designated calibration wordline ($WL_C$) 350 of NAND block 210 may be programmed with a pre-defined data pattern, as shown by the dashed box labelled 350. In the illustrated embodiment, the calibration $WL_C$ 350 is the first WL of NAND block 210, although any other one or more wordlines of a given NAND block may be programmed with a pre-defined data pattern, including the last WL of a NAND block or any one or more wordlines located in-between the first WL and the last WL of NAND block 210. In the QLC memory embodiment of FIGS. 3A and 3B, the same pre-defined data pattern covers (or is applied to) all four levels $211_1$, $211_2$, $211_3$ and $211_4$ of NAND block 210. In other embodiments that employ NAND memory having more or less than four levels, a calibration WL may be programmed with a pre-defined data pattern that covers all existing level/s of the given NAND block. SSD controller 206 may write data to, read data from, and/or erase data from, the remaining memory cells 360 of the other (non-calibration) wordlines ($WL_D$)'s of NAND block 210 that are different from the designated calibration wordline ($WL_C$) 350) in response to write, read and/or erase commands received by SSD controller 206 from host programmable integrated circuit 155.

Figure 4:
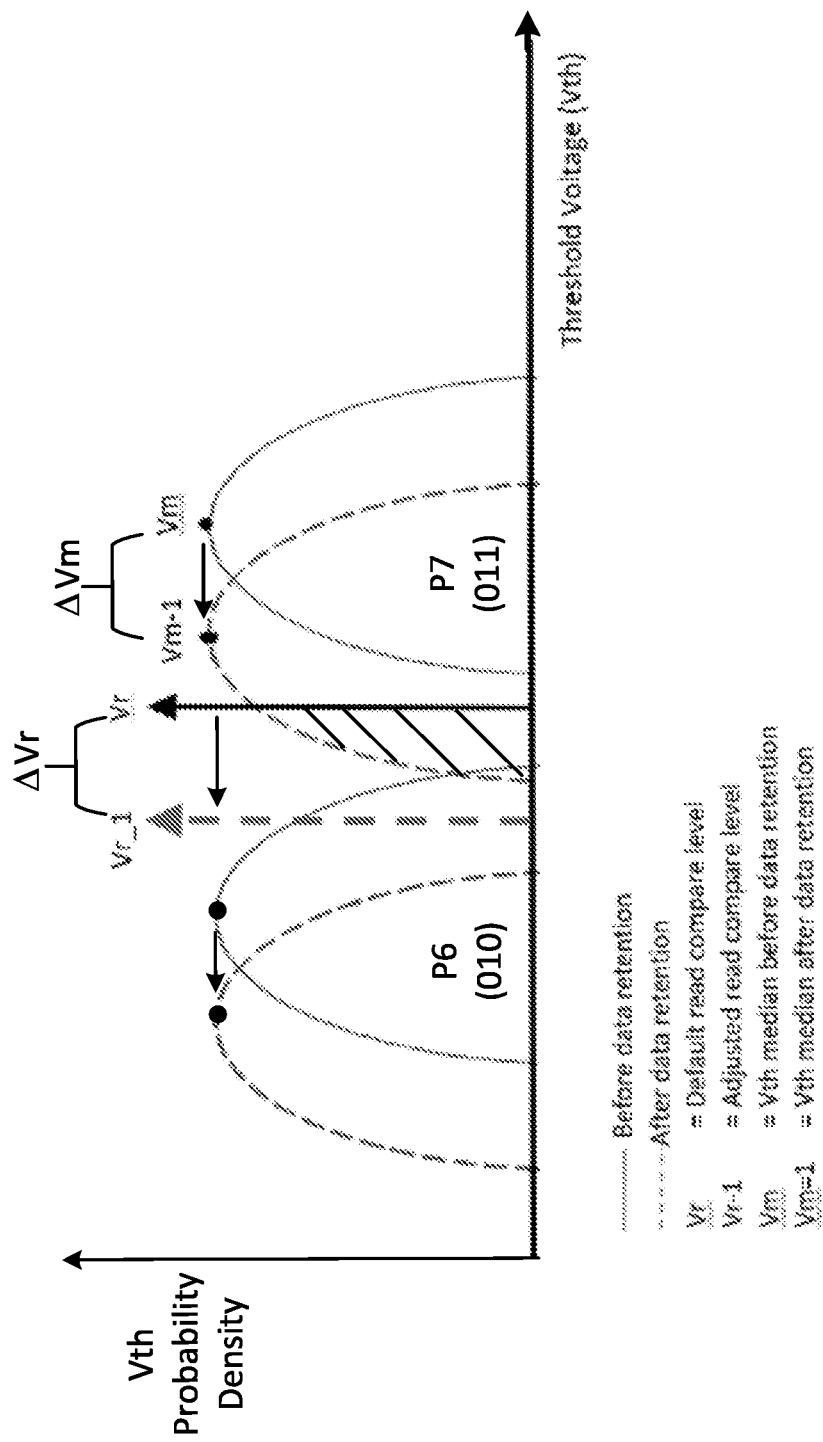
FIG. 4 illustrates voltage threshold (Vth) shift and correction thereof according to one exemplary embodiment of the disclosed systems and methods.

FIG. 4 illustrates an example of the effect of voltage threshold (Vth) shift caused by floating gate (or charge trap) charge loss during an extended data retention time for a triple-level cell (TLC) NAND memory block, and a correction according to one exemplary embodiment that may be made to Vr to compensate for this shift. In FIG. 4, the initial threshold voltage (Vth) probability distribution of each of the two highest possible threshold voltage states "P6" and "P7" of TLC NAND memory is represented by a respective solid-line curve of probability density across all flash memory cells of a NAND flash memory device 208 that spans across a voltage window defined for that respective state. As shown, the ER state corresponds to a "1" bit and the P1 state corresponds to a programmed "0" bit. In FIG. 4, a solid line default read compare voltage level (Vr) lies in-between and completely separates the P6 and P7 voltage windows from each other. Thus, prior to floating gate (or charge trap) charge loss during data retention, Vr may be used to correctly determine the difference between the P6 and P7 states, i.e., a read cell voltage less than Vr corresponds to the P6 state and a read cell voltage greater than Vr corresponds to the P7 state.

Also shown in FIG. 4 are dashed-line probability density curves corresponding to each of shifted threshold voltage states P6 and P7 that exist after an elapsed data retention time. During the elapsed data retention time, floating gate (or charge trap) charge loss causes a portion of the shifted voltage threshold probability density curve of the P7 state to drop below the original default read compare voltage level (Vr), i.e., as shown in FIG. 4 by the hashed area of the P7 probability density curve which lies to the left of the original solid default Vr level line. Therefore, those read P7 voltage values that lie below the original default level (Vr) will yield an incorrect determination of a "P6" state when read after the elapsed data retention time. The amount of voltage threshold shift between the original and shifted probability density curves may be expressed by determining the voltage difference ($\Delta$Vm) between the original voltage threshold median (Vm) of a given probability density curve to the shifted voltage threshold median (Vm−1) of the same given probability density curve.

To correct for the voltage threshold shift shown in FIG. 4, an adjusted read compare level (Vr−1) is determined as shown by the dashed line in FIG. 4. In one embodiment, the value of the adjusted Vr−1 may be determined by shifting the value of the original default read compare voltage level Vr downward by a voltage difference (λVr) that is equal to the measured difference in voltage (ΔVm) of the voltage shift between Vm and Vm−1. As shown, the resulting dashed-line adjusted read compare voltage (Vr−1) completely separates the shifted P6 and P7 voltage windows from each other after floating gate (or charge trap) charge loss during data retention. Thus, after floating gate (or charge trap) charge loss, Vr−1 may be used to correctly determine the difference between the P6 and P7 states, i.e., a read cell voltage less than Vr−1 corresponds to the P6 state and a read cell voltage greater than Vr−1 corresponds to the P7 state.

Figure 5:
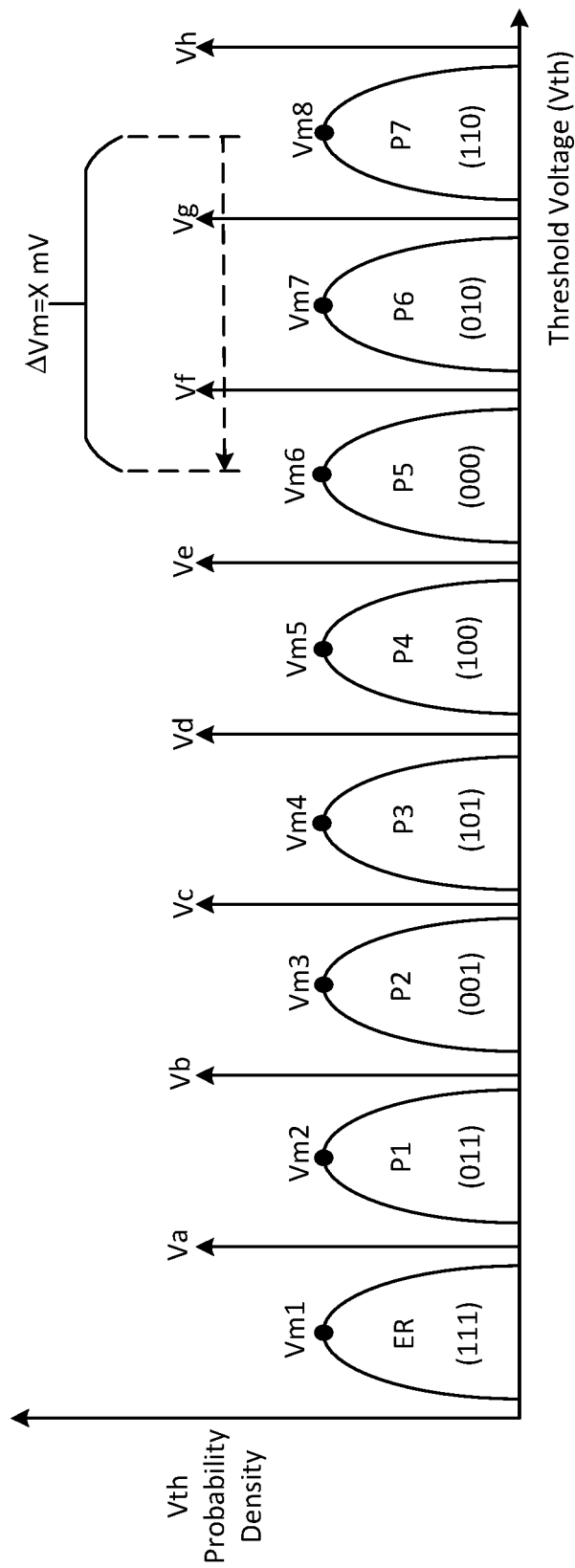
FIG. 5 illustrates voltage threshold (Vth) shift and correction thereof according to one exemplary embodiment of the disclosed systems and methods.

FIG. 5 illustrates another example of the effect of voltage threshold (Vth) shift caused by floating gate (or charge trap) charge loss during an extended data retention time for a tri-level cell (QLC) NAND memory block. In FIG. 5, the initial threshold voltage (Vth) probability distribution of each of eight possible voltage states "ER" and "P1" to "P7" is represented by a respective curve of probability density across all flash memory cells of a NAND flash memory device 208 for the voltage window corresponding to that respective voltage state. Also shown in parenthesis are bit values (most significant bit, center significant bit, and least significant bit) corresponding to each of these eight possible threshold voltage states. A different respective voltage level (Va) to (Vh) lies in-between and completely separates each of the adjacent voltage windows from each other as shown. Thus, prior to floating gate (or charge trap) charge loss during data retention, the default read compare level Vr may be used to correctly determine the existing voltage state of that memory cell, i.e., a read cell voltage greater than Ve and less than Vf corresponds to the P5 voltage state (000).

Still referring to FIG. 5, a designated calibration WL of a given SSD NAND block may be programmed with a predefined TLC data pattern P7 of 110, which initially corresponds to a Vr between Vg and Vh. The predefined TLC data pattern is also stored in firmware to use for comparison to actual read data patterns. Assume now that during SSD operation the Vr read out for the memory cells of the calibration WL is instead between Ve and Vf, which corresponds to TLC data pattern P5 of 000. This actual read data pattern P5 may then be compared to the predefined TLC data pattern stored in firmware (e.g., by analyzing data shift pattern and statistics using Vth shift compensation logic 222) to determine how much voltage shift in the Vth distribution has occurred, and then to apply the same amount of voltage shift to Vr to calculate a new Vr−1 value. For example, in the present case, it may be determined that a Vth shift downward has occurred that corresponds to a ΔVm of X mL±tolerance, e.g., due to floating gate (or charge trap) charge loss that has occurred during a data retention time period. This same downward Vth shift may then be applied to shift the default Vr value downward to determine the new Vr−1 value.

In this example of FIG. 5, the value of "X" millivolts corresponds to the Vth difference between Vm8 and Vm6 that is determined by the comparison to the stored predefined TLC data pattern. To compensate for this determined Vth shift, the read compare level Vr is also shifted downward by the same X mV±tolerance to compensate for the measured downward Vth shift before executing a read retry of the memory cells of the given SSD NAND block. During the read retry using the new and reduced read compare level Vr, the memory cells of designated calibration WL will correctly read between Vg and Vh. The memory cells of the remaining WLs of the SSD NAND block may also be correctly read using the new reduced read compare level Vr.

Figure 6:
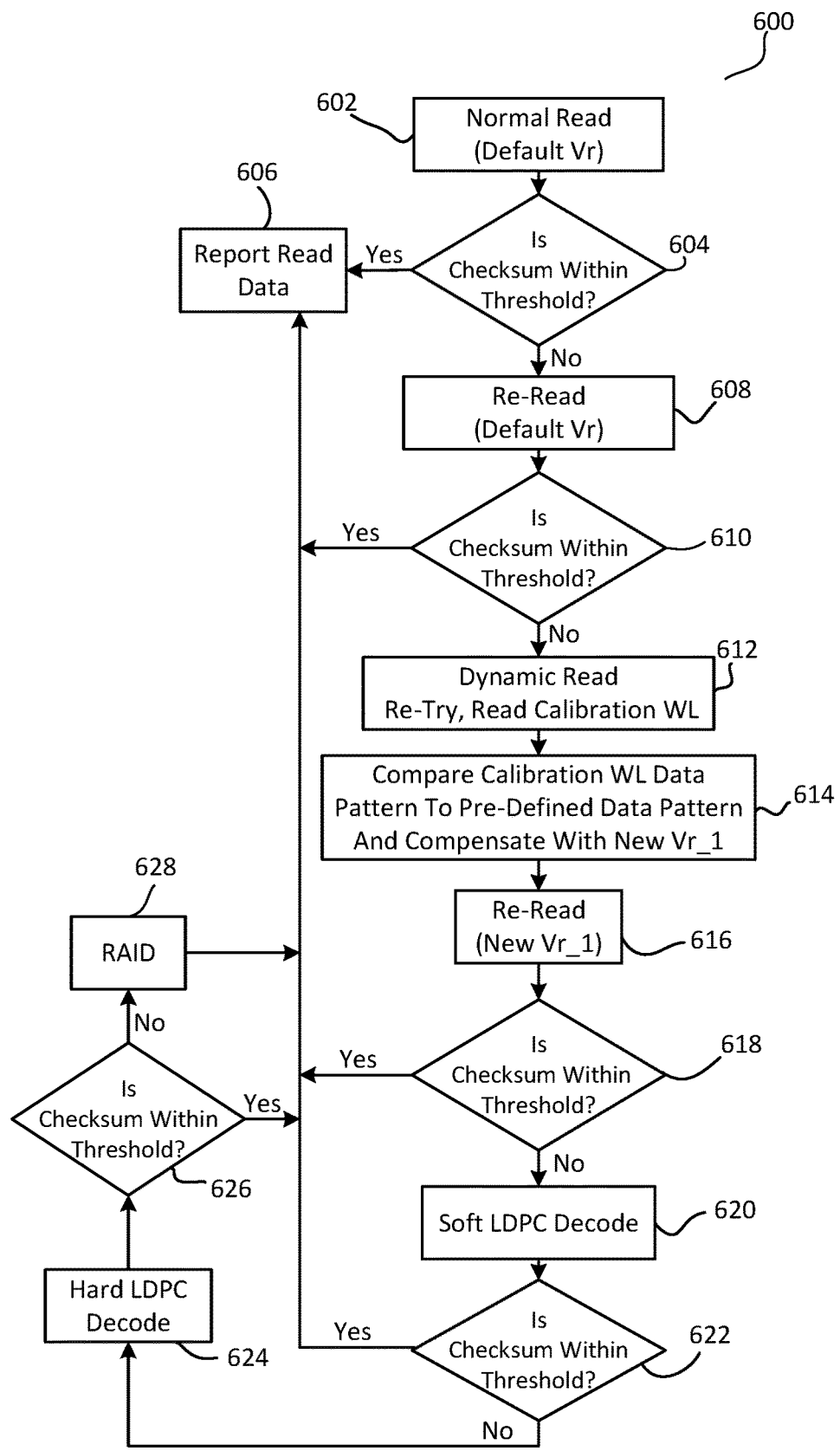
FIG. 6 illustrates methodology according to one exemplary embodiment of the disclosed systems and methods.

FIG. 6 illustrates methodology 600 that may be performed (e.g., by SSD controller 206) to compensate for NAND flash memory voltage threshold (Vth) shift such as described above in relation to FIG. 5, it being understood that methodology 600 may be performed by SSD controller 206 in one embodiment to separately compensate for NAND flash memory voltage threshold (Vth) shift in each of the different NAND blocks 210 of NAND flash device 208 of FIG. 2. As shown, methodology 600 begins in step 602 where a normal read of one or more NAND blocks 210 is made using the default original read compare level Vr, e.g., in response to a read request received by SSD controller 206 from host programmable integrated circuit 155. In one embodiment, a checksum of the read data may be computed and compared to parity in step 604 to determine if the number of read errors (e.g., expressed as number of read errors or a read error rate such as RBER) falls within a maximum acceptable number of read errors, e.g., defined by a maximum checksum error threshold. If the number of read errors fall within the maximum acceptable error threshold in step 604, then methodology proceeds to step 606 where the read data from the NAND block/s 210 is reported as read to the host programmable integrated circuit 155. However, it will be understood that any other alternative technique may be employed in step 604 that is suitable for determining a number of read errors and/or a read error rate.

If the number of read errors does not fall within the maximum acceptable read error threshold in step 604, then methodology 600 proceeds to step 608 where an optional read-retry of the NAND block/s 210 is again made using the default read compare level Vr. A checksum of the read-retry data is computed and compared to parity in step 610 to determine if the number of read errors again falls within a maximum acceptable number of errors defined by the maximum checksum error threshold. If the number of read errors again falls within the maximum acceptable error threshold in step 610, then methodology proceeds to step 606 where the read data from the NAND block/s 210 is reported as read to the host programmable integrated circuit 155.

However, if the number of read errors does not fall within the maximum acceptable read error threshold in step 610, then methodology 600 proceeds to step 612 where a dynamic read-retry of the calibration WL 350 of the NAND block/s 210 is made using the original default read compare level Vr to read a value of the data pattern of the memory cells in the calibration WL 350. Then in step 614 the read data pattern value of step 612 is compared to a stored value of the pre-defined data pattern that is maintained in non-volatile memory of the firmware 230 of the SSD controller 187. This comparison may be made to determine a compensated read compare level Vr−1, for example, according to the methodology described in relation to FIG. 5. Then, a read of the one or more NAND blocks 210 is made in step 616 using the new compensated read compare level Vr−1. A checksum of the data read in step 616 is then computed and compared to parity in step 618 to determine if the number of read errors falls within a maximum acceptable number of read errors defined by the maximum checksum read error threshold. If the number of errors fall within the maximum acceptable error threshold in step 618, then methodology proceeds to step 606 where the read data from the NAND block/s 210 is reported as read to the host programmable integrated circuit 155.

However, if the number of read errors does not fall within the maximum acceptable error threshold in step 618, then methodology 600 proceeds to optional step 620 where a soft low density parity code (LDPC) decode operation may be performed, and then checksum of the resulting data computed and compared to parity in step 622. If the number of read errors falls within the maximum acceptable error threshold in step 622, then methodology proceeds to step 606 where the read data from the NAND block/s 210 is reported as read to the host programmable integrated circuit 155.

However, if the number of read errors does not fall within the maximum acceptable error threshold in step 622, then methodology 600 proceeds to optional step 624 where a hard LDPC decode operation may be performed, and then checksum of the resulting data computed and compared to parity in step 626. If the number of read errors falls within the maximum acceptable error threshold in step 626, then methodology proceeds to step 606 where the read data from the NAND block/s 210 is reported as read to the host programmable integrated circuit 155. However, if the number of read errors does not fall within the maximum acceptable read error threshold in step 626, then methodology 600 proceeds to optional step 628 where data correction and/or reconstruction is performed from a redundant array of independent disks (RAID), and the resulting data is reported as read in step 606 to the host programmable integrated circuit 155.

It will be understood that the steps of methodology 600 described herein are exemplary only, and that any other sequence or combination of additional, fewer and/or alternative steps may be employed that is suitable for compensating for NAND flash memory voltage threshold (Vth) shift by using one or more designated calibration wordlines in a manner as described herein.

It will also be understood that one or more of the tasks, functions, or methodologies described herein for an information handling system or component thereof (e.g., including those described herein for components 155, 182, 206, 220, 222, 230, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such programmable integrated circuits may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein. It will also be understood that one or more steps of the present methodologies may be employed in one or more code segments of the computer program. For example, a code segment executed by the information handling system may include one or more steps of the disclosed methodologies. It will be understood that a programmable integrated circuit may be configured to execute or otherwise be programmed with software, firmware, logic, and/or other program instructions stored in one or more non-transitory tangible computer-readable mediums (e.g., example, data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random update memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:
1. A method, comprising:
   reading data from at least one memory block using multiple separate wordlines, the at least one memory block comprising multiple memory pages that each comprise a different group of memory cells, each of the memory cells storing an electron charge having a voltage corresponding to a stored data value, and each of the separate wordlines being coupled to a different group of the memory cells that corresponds to one of the memory pages of the at least one memory block;
   where a designated one of the multiple memory pages comprises a group of memory cells that are programmed with stored data values corresponding to a pre-defined data pattern; and where the method further comprises:
reading a current data pattern stored in the memory cells of the designated memory page using a default read compare voltage (Vr);
then comparing the read current data pattern to the pre-defined data pattern to determine a magnitude of a shift in voltage of the stored charge in each of the memory cells of the designated memory page between the current data pattern and the pre-defined data pattern; and
then determining an adjusted read compare voltage (Vr−1) based on the determined magnitude of the shift in voltage of the stored charge in the memory cells of the designated memory page.

2. The method of claim 1, where the at least one memory block comprises an array of memory cells that are grouped in rows to define the multiple separate memory pages, each of the multiple separate memory pages comprising a separate row of the memory cells that are coupled together by a different one of the multiple separate wordlines; and where the method further comprises:
reading the stored data value of each given memory cell of the array of memory cells by determining the voltage of the stored charge in the given memory cell relative to the read compare voltage (Vr);
then determining the adjusted read compare voltage (Vr−1) based on the determined magnitude of shift in voltage of the stored charge in the memory cells of the designated memory page; and
then re-reading the stored data value of each given memory cell of the array of memory cells by determining the voltage of the stored charge in the given memory cell relative to the adjusted read compare voltage (Vr−1).

3. The method of claim 1, where the magnitude of a shift in the voltage of the stored charge in each of the memory cells of the designated memory page corresponds to a determined difference between the current data pattern and the pre-defined data pattern; and where the method further comprises determining the adjusted read compare voltage (Vr−1) by shifting the value of the default read compare voltage (Vr) downward by a voltage difference that is equal to the determined magnitude of the shift in voltage of the stored charge in the memory cells of the designated memory page.

4. The method of claim 1, further comprising:
reading the stored data value of each given memory cell of the array of memory cells by determining the voltage of the stored charge in the given memory cell relative to the read compare voltage (Vr);
then determining a number of read errors or a read error rate for the read stored data;
then comparing the number of read errors or the read error rate to a pre-defined maximum threshold number of read errors or to a threshold maximum read error rate; and then either one of:
providing the read data to a different programmable integrated circuit only if the number of read errors or the read error rate is less than or equal to the pre-defined maximum threshold number of read errors or the threshold maximum read error rate, or
re-reading the stored data value of each given memory cell of the array of memory cells by determining the voltage of the stored charge in the given memory cell relative to the adjusted read compare voltage (Vr−1) and provide the re-read data to the different programmable integrated circuit only if the number of read errors or the read error rate is greater than the pre-defined maximum threshold number of read errors or the threshold maximum read error rate.

5. The method of claim 4, where the different programmable integrated circuit is a host programmable integrated circuit of an information handling system; and where the multiple memory blocks and the at least one programmable integrated circuit are components of a solid state drive (SSD) coupled to the host programmable integrated circuit.

6. The method of claim 1, where the at least one memory block comprises multiple memory blocks; where each of the separate wordlines is coupled to a different group of memory cells that corresponds to one of the memory pages of the multiple memory blocks; where a designated one of the multiple memory pages of each of the multiple memory blocks comprises a group of memory cells that are programmed with stored data values corresponding to the pre-defined data pattern; and where the method further comprises:
reading a current data pattern stored in the memory cells of the designated memory page of each of the multiple memory blocks using a default read compare voltage (Vr);
then comparing the read current data pattern to the pre-defined data pattern to determine a magnitude of a shift in voltage of the stored charge in each of the memory cells of the designated memory page of each of the multiple memory blocks between the current data pattern and the pre-defined data pattern; and
then determining an adjusted read compare voltage (Vr−1) based on the determined magnitude of the shift in voltage of the stored charge in the memory cells of the designated memory page of each of the multiple memory blocks.

7. The method of claim 1, where the at least one memory block comprises an array of memory cells arranged in columns and rows, each row of memory cells coupled together to form a wordline of the memory block, and each column of memory cells coupled together to form a bitline (BL) of the memory block.

8. The method of claim 1, where the at least one memory block comprises one of a single-level cell (SLC) NAND memory, a multi-level cell (MLC) NAND memory, a triple-level cell (TLC) NAND memory, or a quad-level cell (QLC) NAND memory.

9. A system, comprising:
at least one memory block comprising multiple memory pages that each comprise a different group of memory cells, each of the memory cells storing an electron charge having a voltage corresponding to a stored data value; and
at least one programmable integrated circuit coupled to multiple separate wordlines, each of the separate wordlines being coupled to a different group of memory cells that corresponds to one of the memory pages of the at least one memory block;
where a designated one of the multiple memory pages comprises a group of memory cells that are programmed with stored data values corresponding to a pre-defined data pattern; and
where the at least one programmable integrated circuit is programmed to:
read a current data pattern stored in the memory cells of the designated memory page using a default read compare voltage (Vr);
then compare the read current data pattern to the pre-defined data pattern to determine a magnitude of a shift in voltage of the stored charge in each of the memory cells of the designated memory page between the current data pattern and the pre-defined data pattern; and then determine an adjusted read compare voltage (Vr−1) based on the determined magnitude of the shift in voltage of the stored charge in the memory cells of the designated memory page.

10. The system of claim 9, where the at least one memory block comprises an array of memory cells that are grouped in rows to define the multiple separate memory pages, each of the multiple separate memory pages comprising a separate row of the memory cells that are coupled together by a different one of the multiple separate wordlines; and where the at least one programmable integrated circuit is programmed to:

read the stored data value of each given memory cell of the array of memory cells by determining the voltage of the stored charge in the given memory cell relative to the read compare voltage (Vr);

then determine the adjusted read compare voltage (Vr−1) based on the determined magnitude of shift in voltage of the stored charge in the memory cells of the designated memory page; and then re-read the stored data value of each given memory cell of the array of memory cells by determining the voltage of the stored charge in the given memory cell relative to the adjusted read compare voltage (Vr−1).

11. The system of claim 9, where the magnitude of a shift in voltage of the stored charge in each of the memory cells of the designated memory page corresponds to a determined difference between the current data pattern and the pre-defined data pattern; and where the programmable integrated circuit is further programmed to determine the adjusted read compare voltage (Vr−1) by shifting the value of the default read compare voltage (Vr) downward by a voltage difference that is equal to the determined magnitude of the shift in voltage of the stored charge in the memory cells of the designated memory page.

12. The system of claim 9, where the programmable integrated circuit is programmed to:

read the stored data value of each given memory cell of the array of memory cells by determining the voltage of the stored charge in the given memory cell relative to the read compare voltage (Vr);

then determine a number of read errors or a read error rate for the read stored data;

then compare the number of read errors or the read error rate to a pre-defined maximum threshold number of read errors or to a threshold maximum read error rate; and then either one of:

provide the read data to a different programmable integrated circuit only if the number of read errors or the read error rate is less than or equal to the pre-defined maximum threshold number of read errors or the threshold maximum read error rate, or re-read the stored data value of each given memory cell of the array of memory cells by determining the voltage of the stored charge in the given memory cell relative to the adjusted read compare voltage (Vr−1) and provide the re-read data to the different programmable integrated circuit only if the number of read errors or the read error rate is greater than the pre-defined maximum threshold number of read errors or the threshold maximum read error rate.

13. The system of claim 9, where the at least one memory block comprises multiple memory blocks; where each of the separate wordlines is coupled to a different group of memory cells that corresponds to one of the memory pages of the multiple memory blocks; where a designated one of the multiple memory pages of each of the multiple memory blocks comprises a group of memory cells that are programmed with stored data values corresponding to the pre-defined data pattern; and where the at least one programmable integrated circuit is programmed to:

read a current data pattern stored in the memory cells of the designated memory page of each of the multiple memory blocks using a default read compare voltage (Vr);

then compare the read current data pattern to the pre-defined data pattern to determine a magnitude of a shift in voltage of the stored charge in each of the memory cells of the designated memory page of each of the multiple memory blocks between the current data pattern and the pre-defined data pattern; and then determine an adjusted read compare voltage (Vr−1) based on the determined magnitude of the shift in voltage of the stored charge in the memory cells of the designated memory page of each of the multiple memory blocks.

14. The system of claim 13, further comprising a solid state drive (SSD) that includes the multiple memory blocks and the at least one programmable integrated circuit.

15. The system of claim 9, where the at least one memory block comprises an array of memory cells arranged in columns and rows, each row of memory cells coupled together to form a wordline of the memory block, and each column of memory cells coupled together to form a bitline (BL) of the memory block.

16. The system of claim 9, where the at least one memory block comprises one of a single-level cell (SLC) NAND memory, a multi-level cell (MLC) NAND memory, a triple-level cell (TLC) NAND memory, or a quad-level cell (QLC) NAND memory.

17. An information handling system, comprising:

a host programmable integrated circuit;

a solid state drive (SSD) coupled to the host programmable integrated circuit, the SSD comprising:

at least one memory block comprising multiple memory pages that each comprise a different group of memory cells, each of the memory cells storing an electron charge having a voltage corresponding to a stored data value, and at least one programmable integrated circuit coupled to multiple separate wordlines, each of the separate wordlines being coupled to a different group of memory cells that corresponds to one of the memory pages of the at least one memory block, where a designated one of the multiple memory pages comprises a group of memory cells that are programmed with stored data values corresponding to a pre-defined data pattern; and where the at least one programmable integrated circuit of the SSD is programmed to:

read a current data pattern stored in the memory cells of the designated memory page using a default read compare voltage (Vr), then compare the read current data pattern to the pre-defined data pattern to determine a magnitude of a shift in voltage of the stored charge in each of the memory cells of the designated memory page between the current data pattern and the pre-defined data pattern, then determine an adjusted read compare voltage (Vr−1) based on the determined magnitude of the shift in voltage of the stored charge in the memory cells of the designated memory page, then re-read the stored data value of each given memory cell of the array of memory cells by determining the voltage of the stored charge in the given memory cell relative to the adjusted read compare voltage (Vr−1), and then provide the re-read data to the host programmable integrated circuit.

18. The information handling system of claim 17, where the magnitude of a shift in voltage of the stored charge in each of the memory cells of the designated memory page corresponds to a determined difference between the current data pattern and the pre-defined data pattern; and where the programmable integrated circuit of the SSD is further programmed to determine the adjusted read compare voltage (Vr−1) by shifting the value of the default read compare voltage (Vr) downward by a voltage difference that is equal to the determined magnitude of the shift in voltage of the stored charge in the memory cells of the designated memory page.

19. The information handling system of claim 17, where the programmable integrated circuit of the SSD is programmed to:

read the stored data value of each given memory cell of the array of memory cells by determining the voltage of the stored charge in the given memory cell relative to the read compare voltage (Vr);

then determine a number of read errors or a read error rate for the read stored data;

then compare the number of read errors or the read error rate to a pre-defined maximum threshold number of read errors or to a threshold maximum read error rate; and then either one of:

report the read data to the host programmable integrated circuit only if the number of read errors or the read error rate is less than or equal to the pre-defined maximum threshold number of read errors or the threshold maximum read error rate, or re-read the stored data value of each given memory cell of the array of memory cells by determining the voltage of the stored charge in the given memory cell relative to the adjusted read compare voltage (Vr−1) and report the re-read data to the host programmable integrated circuit only if the number of read errors or the read error rate is greater than the pre-defined maximum threshold number of read errors or the threshold maximum read error rate.

20. The information handling system of claim 17, where the at least one memory block comprises multiple memory blocks; where each of the separate wordlines is coupled to a different group of memory cells that corresponds to one of the memory pages of the multiple memory blocks; where a designated one of the multiple memory pages of each of the multiple memory blocks comprises a group of memory cells that are programmed with stored data values corresponding to the pre-defined data pattern; and where the at least one programmable integrated circuit is programmed to:

read a current data pattern stored in the memory cells of the designated memory page of each of the multiple memory blocks using a default read compare voltage (Vr);

then compare the read current data pattern to the pre-defined data pattern to determine a magnitude of a shift in voltage of the stored charge in each of the memory cells of the designated memory page of each of the multiple memory blocks between the current data pattern and the pre-defined data pattern; and then determine an adjusted read compare voltage (Vr−1) based on the determined magnitude of the shift in voltage of the stored charge in the memory cells of the designated memory page of each of the multiple memory blocks.

\* \* \* \* \*